United States Patent [19]

Giovachini et al.

[11] 4,183,259

[45] Jan. 15, 1980

[54] WHEEL STRUCTURE ADAPTED TO SPIN AT HIGH ANGULAR VELOCITIES AND METHOD OF MANUFACTURING THE SAME

[75] Inventors: Jean-Luc Giovachini; Jean-Pierre Pascal, both of Paris; Dante M. Vendramini, Asnieres, all of France

[73] Assignees: Institut de Recherche des Transports, Arcueil; Dante Marc Vendramini, Asnieres, both of France

[21] Appl. No.: 797,659

[22] Filed: May 17, 1977

Related U.S. Application Data

[63] Continuation-in-part of Ser. No. 605,873, Aug. 19, 1975, abandoned.

[30] Foreign Application Priority Data

Aug. 22, 1974 [FR] France ................................ 74 28905

[51] Int. Cl.² .............................................. F16C 15/00
[52] U.S. Cl. .................................... 74/572; 74/573 R
[58] Field of Search ...................... 74/572, 573 R, 574; 156/169, 172

[56] References Cited

U.S. PATENT DOCUMENTS

| | | | |
|---|---|---|---|
| 3,602,067 | 8/1971 | Wetherbee, Jr. | 74/572 |
| 3,724,288 | 4/1973 | Jakubowski | 74/572 |
| 3,964,341 | 6/1976 | Rabenhorst | 74/572 |
| 3,977,273 | 8/1976 | Ernst et al. | 74/572 |
| 4,000,665 | 1/1977 | Rabenhorst | 74/572 |
| 4,098,142 | 7/1978 | Weyler, Jr. | 74/572 |

FOREIGN PATENT DOCUMENTS 2119015 10/1972 Fed. Rep. of Germany ............ 74/572

*Primary Examiner*—Samuel Scott
*Assistant Examiner*—Daniel J. O'Connor
*Attorney, Agent, or Firm*—Karl W. Flocks

[57] ABSTRACT

A wheel structure such as a flywheel with hub and rim adapted for use at high angular velocities including a strong, compact and perfectly balanced coiling formed by a radiating winding of at least two cables linking the wheel hub to the wheel rim and enveloping the rim. Also the method of manufacturing of the wheel structure by winding of the cables between the wheel hub and wheel rim by cables continuously dispensed under constant tension looped around the wheel rim.

8 Claims, 5 Drawing Figures

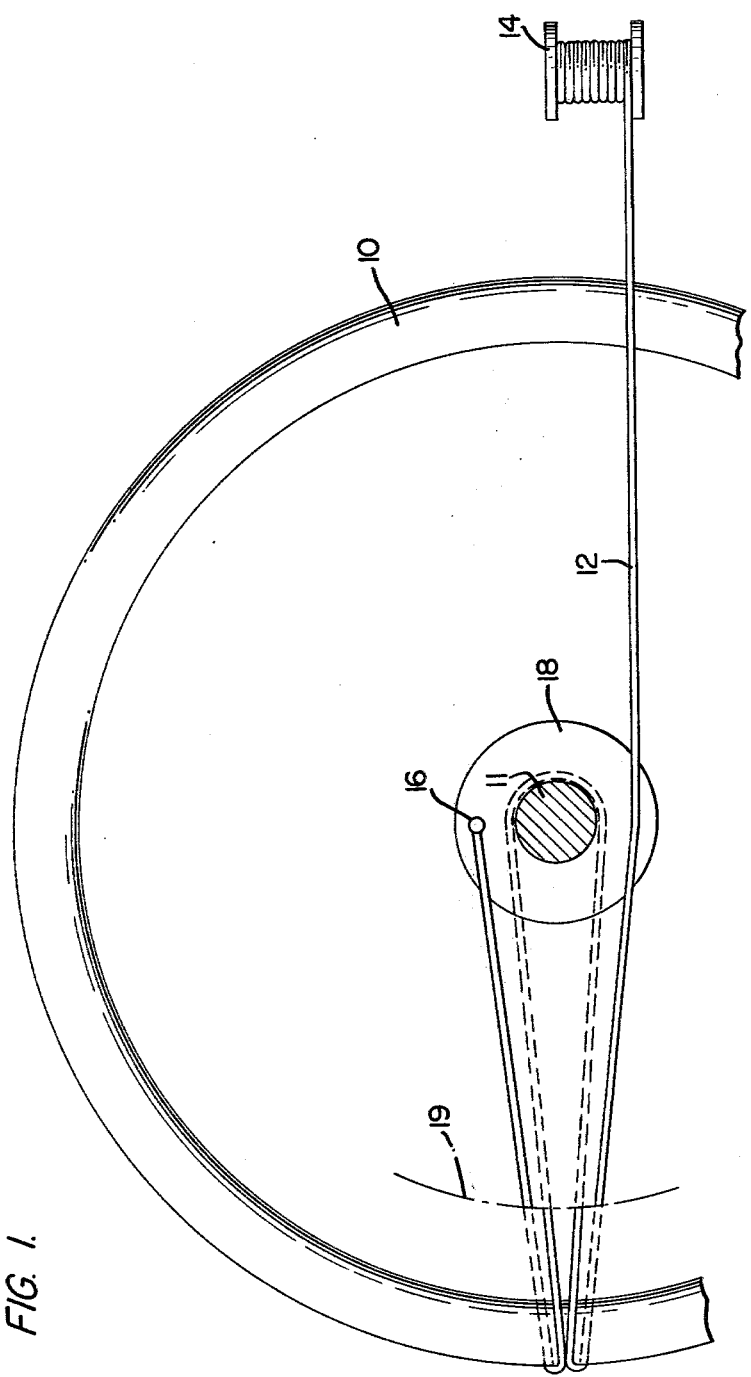
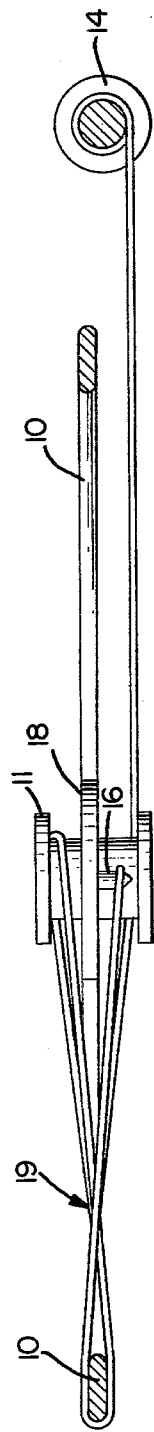
FIG. 1.
FIG. 2.

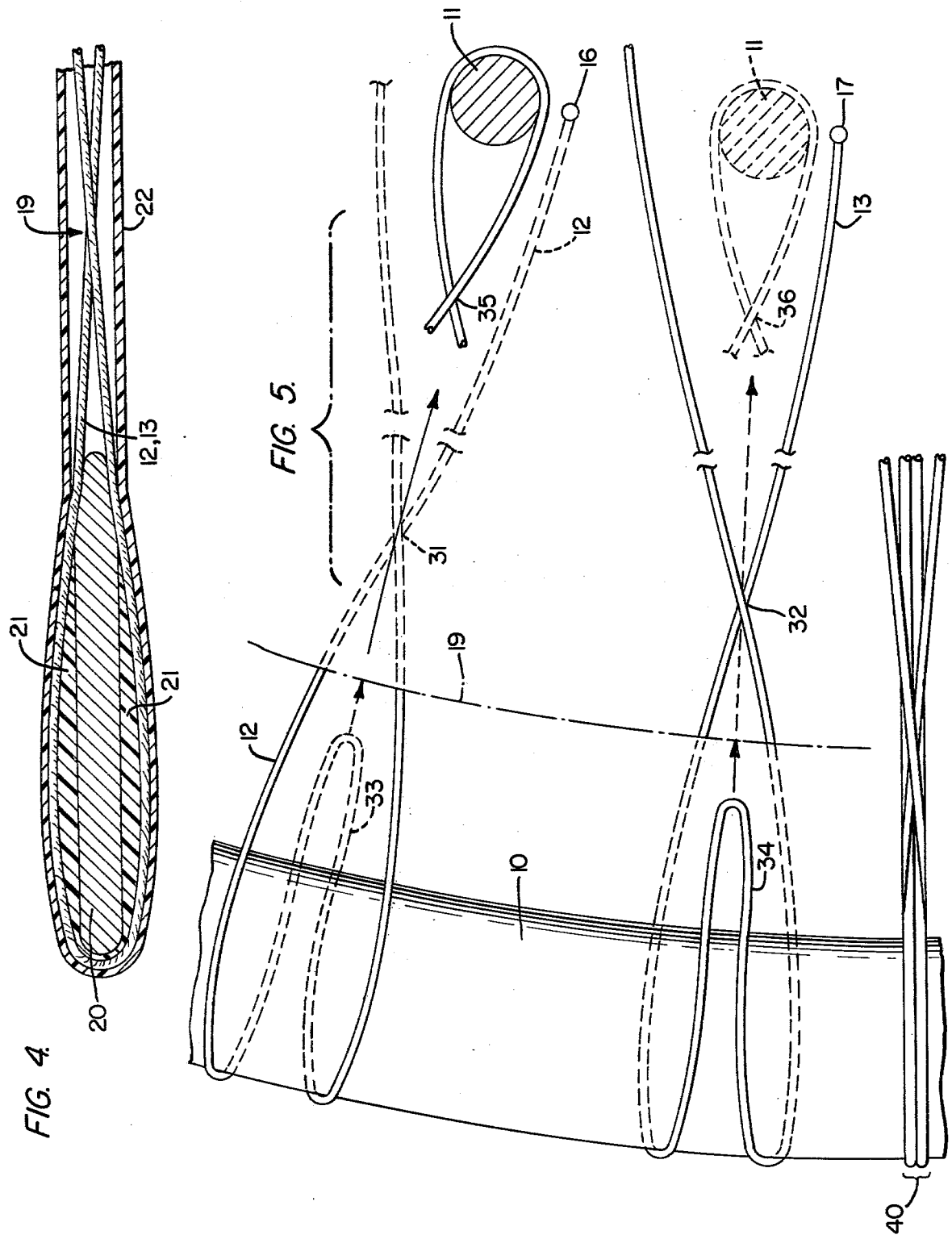

WHEEL STRUCTURE ADAPTED TO SPIN AT HIGH ANGULAR VELOCITIES AND METHOD OF MANUFACTURING THE SAME

BACKGROUND OF THE INVENTION

This is a continuation-in-part of the application by the same inventors entitled WHEEL STRUCTURE ADAPTED TO HIGH ANGULAR VELOCITIES AND METHOD OF MANUFACTURING THE SAME, filed Aug. 19, 1975 and having Ser. No. 605,873, now abandoned.

The present invention relates to a wheel structure suitable for spinning at high angular velocities, and to a method of manufacturing the same.

The wheel structure of the present invention has many applications for which its structure allows it to be used for spinning at very high angular velocities.

One application would be as an energy accumulator or flywheel since such wheel structures are capable of storing a large amount of kinetic energy.

Another application could be in the electrical field for a very high-speed rotating assembly where the cable or wire wound as in the present invention would give added strength to the structure connecting the wheel rim which in this case would form the armature having a thin circular metallic rim. The rotating assembly could then constitute a test wheel for an eddy-current machine, a linear motor, a brake, or magnetic suspension magnets, such a machine being built to scale in order to simulate the full-scale machine and deduce its electromechanical characteristics at lower cost. By reason of the laws of similar phenomena, in order to be able to exploit the findings of such tests on scale models it is necessary to operate the models at speeds that are all the higher as the scale is smaller. Thus, if the full size machine is designed to operate at 200 rpm, then it must be possible to test a one-third scale model at up to 600 rpm. Consequently the advantage of being able to increase the test speeds will readily be appreciated, since it enables the use of a smaller scale model.

SUMMARY OF THE INVENTION

A wheel structure adapted for use with high angular velocities in accordance with this invention includes a strong, compact and perfectly balanced cable winding formed by a radiating winding of at least two cables, which winding links the wheel hub to the wheel rim and envelops the wheel rim and includes an annular crossover of the cable between the rim and the hub that closes the winding about the rim.

In accordance with the method of manufacturing the wheel structure of the present invention, each of the radiating cables is distributed continuously at a constant tension about the rim.

The rim of the wheel structure may be formed of a thin, circular, metallic ring.

The cables may be of resin-fiber-reinforced plastic with bulging envelopes between rim and cables, and an outer skin over the cables of a similar material.

BRIEF DESCRIPTION OF THE DRAWINGS

Further characteristics and advantages of the present invention will emerge from the description which follows with reference to the accompanying drawings, in which:

FIG. 1 is a partial view of the winding of a cable on the wheel rim and wheel hub according to the present invention viewed from the bottom face of the wheel structure or face A according to FIG. 2;

FIG. 2 is a partially sectioned view of the wheel structure lying in a horizontal plane;

FIG. 4 is a sectional partial view of a modified rim with an outer skin overall;

FIG. 5 is a diagrammatical illustration in top plan view from face B of a variation in the method of winding the cables.

DESCRIPTION OF THE PREFERRED EMBODIMENTS

Figure 3:
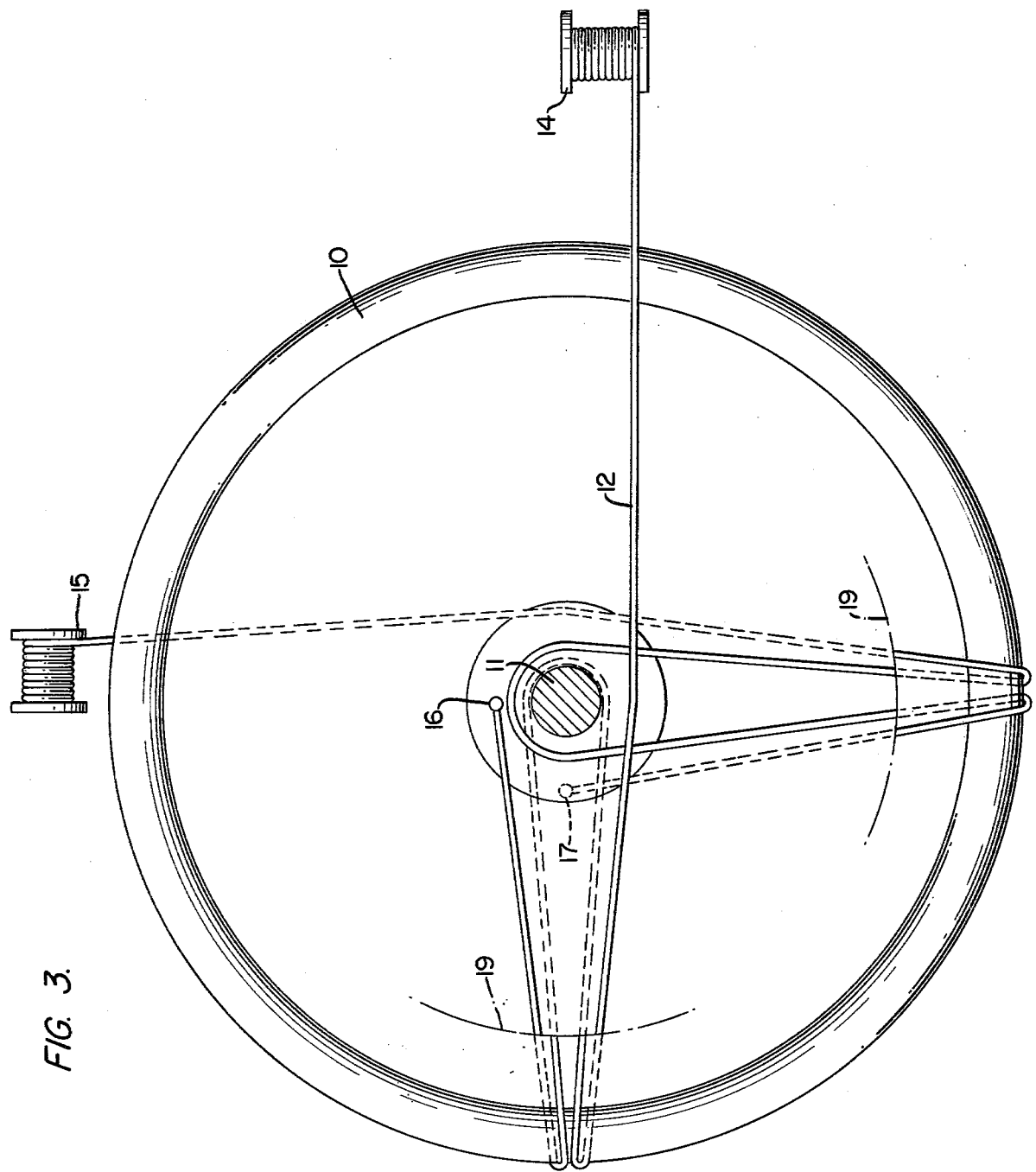
FIG. 3 is a view similar to FIG. 1 showing two cables being wound simultaneously in accordance with the present invention.

In the form of embodiment shown in FIGS. 1 and 2, the wheel structure serves as a support for a thin circular metallic rim 10 connected to a centrally situated hub 11 and restrained at the wheel structure periphery by cable 12. As shown in FIG. 3 at least two cables 12 and 13 are unwound from spools 14 and 15 respectively and wound radially to provide a link between wheel hub 11 and circular rim 10.

The cables are preferably continuous cables made of resin-fiber-reinforced plastic (hereinafter abbreviated RFRP), the reinforcing fiber being possibly glass or organic fiber.

In a modified form of the rim in FIG. 4 are shown bulging circular envelopes 21, preferably likewise made of RFRP, disposed between the thin metallic rim 20 and the wound cable 12 or 13 in roder to avoid buckling of the thin circular rim 20 and to assist the winding cycle.

An outer skin 22 may be provided around the wound cables 12, 13 and is preferably made of a laminated fabric of hign-tensile RFRP filaments.

In FIG. 4 there is space shown between cables 12, 13 and skin 22 in the portion not containing rim 20. This is merely for clarity. When the full winding has been made it is contemplated that the area within skin 22 will in reality be fully occupied by cabling with the exception of a small void 23 immediately adjacent to the end of rim 20 and a similar void immediately adjacent the peripheral edge of separator 18.

The radial winding arrangement for providing the wheel structure of the present invention is obtained with at least two cables 12 and 13 as shown in FIG. 3. The starting point for cable 12 is on a wheel-hub pin 16 mounted to extend axially from an annular central separator 18 of wheel hub 11 from face A of the wheel structure. A wheel hub pin 17 extending from the opposite face, face B, is the starting point for cable 13.

During the winding of cables 12 and 13 about hub 11 and rim 10 the cable passes from face A to face B and vice versa. In order to illustrate this more clearly in the plan views of FIGS. 1 and 3, portions of cables 12 and 13 are in solid line when in the nearer face (face A) and in dashed outline when in the farther face (face B) even though the wheels are not shown as fully wound so as to cover the portions in the farther face. This change of the cables 12, 13 from one face to another on a line around hub 11, concentric with hub 11 and rim 10, is designated as annular crossover zone 19.

The thickness of annular central separator 18 may be chosen as required. Depending on the thickness of separator 18 a void may be provided as desired between the windings of cables 12, 13 extending from hub 11 between faces A and B. This can result in the manufacture of either wheels with flanges formed from the coiling of the cable, known as "flange-coils", and forming a solid flange-coil, or wheels with two flange coils. The void can be extended radially from separator 18 up to annular crossover zone 19.

A preferred method of winding of the cables is shown for one cable in FIGS. 1 and 2, and more fully in FIG. 3, since it is contemplated that the method will involve the winding of several cables simultaneously. In this method illustrated, each of cables 12 and 13 is unwound from spools 14 and 15 respectively which spools are fixed in position outside the wheel. The spools could be moved around the rim and around the hub for obtaining the same winding cycle, but this method would be technically more difficult to achieve.

Using the method illustrated with the fixed spools 14 and 15 placed outside the wheel, the cables 12 and 13 are drawn between wheel hub pins 16 and 17 respectively and spools 14 and 15 respectively. Each of spools 14 and 15 may be provided with cable tension regulating means (not shown).

Each of cables 12 and 13 passes through a similar cycle which is repeated until the winding of all cables is completed. As shown in FIGS. 1 and 2, for one of the cables, cable 12, a doubled cable length is drawn from spool 14 with the opposite end of cable 12 anchored to wheel-hub pin 16. This doubled length of cable 12 is first passed around rim 10. In this passing around rim 10, the doubled length of cable with ends at spool 14 and wheel-hub pin 16 starts is traverse of the wheel in face A. At annular crossover zone 19, the doubled length of cable 12 crosses over into face B. Then, passing around rim 10 for the first time as stated above, the doubled length of cable 12 changes from face B back again to face A until it again passes through annular crossover zone 19 and back to face B. The apex of the doubled length of cable 12 is then drawn toward hub 11 and looped or passed around hub 11.

To continue the winding around rim 10, a doubled length of cable 12 is drawn from spool 14 maintaining tension on the wound portion and partially winding the anchored end around hub 11 and repeating the steps stated above.

In the meantime cable 13 is similarly wound except that cable 13 is anchored on the face B side of seperator 18 and starts its double length traverse of the wheel on face B, passing to face A at annular crossover zone 19, around rim 10 to face B, through annular crossover zone 19 to face A and the apex of the doubled length of cable 13 is then looped or passed around hub 11 on the face A side of the wheel.

Cable 12 is always started from face A and looped around hub 11 on the face B side of the wheel. Cable 13 is always started from face B and looped around hub 11 on the face A side of the wheel. The continuation of the winding of both cables 12 and 13 according to the method described above leads to the forming of two opposite flange coils joining along a circle, between hub 11 and rim 10.

By applying a twist at different points in the process of winding the cables, a variation in the winding can be obtained. For example, as illustrated in FIG. 5, cables 12 and 13 are twisted at portions 31 and 32 respectively before passing through annular crossover zone 19 and then after the doubled portions 33 and 34 respectively are passed around rim 10, portions 33 and 34 are passed between doubled portions of cables 12 and 13 respectively, passing into the plane of the opposite face of the wheel, over twisted portion 31 or under twisted portion 32, respectively, given another twist at points 35 and 36 respectively, and each looped over hub 11. Butt-wound radial cable windings illustrated by wound cable 40 tightened under tension are thus formed, in this case from the illustrated winding of cable 13 in FIG. 5.

Cable windings are wound in sufficient number to form a coil around the wheel with a resistance to centrifugal bursting of the wheel which is constant from the hub to the rim.

The cable twists 31, 32 and 35, 36 tighten the radial cables and counter any tendency for them to spread apart. Furthermore, the twists 31, 32 doubled up by the passage of loops around the rim 10 establish annular crossover zone 19 and wrap around rim 10 to firmly restrain the rim 10 from centrifugal forces.

It will be obvious to those skilled in the art that various changes may be made without departing from the scope of the invention and the invention is not to be considered limited to what is shown in the drawings and described in the specification.

What is claimed is:

1. A wheel structure suitable for spinning at high angular velocities comprising
   a hub,
   a rim concentrically extending around said hub,
   first and second faces on opposite sides of a median plane containing said hub and said rim,
   at least two cable lengths, each extending repetitively between said hub and said rim,
   each of said cable lengths repetitively wound to pass twice around said rim and once around said hub for each cycle of wound cable,
   each said pass around said hub maintained in the same said face and each said pass around said rim extending said cable length from one of said faces into the other of said faces,
   an annular crossover zone extending concentrically between said hub and said rim,
   said cable lengths having their portions extending between said hub and said rim each passing from one of said faces to the other of said faces when passing through said annular crossover zone,
   at least one flange formed from the winding of said at least two cable lengths joining said hub and enveloping said rim to form a balanced assembly.

2. A wheel structure as claimed in claim 1 further characterized by
   twists imparted to said cable lengths between said hub and said rim and to said cable lengths near said hub.

3. A wheel structure as claimed in claim 1 further characterized by
   a separator on said hub in said mediam plane,
   said flange having a void therein determined by the thickness of said separator and said void having a maximum possible extension from said hub to said annular crossover zone.

4. A wheel structure as claimed in claim 1 further characterized by
   said cable lengths made of resin-fiber-reinforced plastic.

5. A wheel structure as claimed in claim 1 further characterized by
   an outer skin provided around said assembly.

6. A wheel structure as claimed in claim 5 further characterized by said outer skin being made of a laminated fabric of resin-fiber-reinforced plastic.

7. A wheel structure as claimed in claim 1 further characterized by said rim being a thin circular metallic armature, a bulged circular envelope over opposite faces of said rim positioned to prevent buckling of said thin circular metallic armature and assist winding said cable lengths around said armature.

8. A wheel structure as claimed in claim 7 further characterized by said bulged circular envelope being made of plastic.